(12) United States Patent
Tomosada

(10) Patent No.: US 10,324,267 B2
(45) Date of Patent: Jun. 18, 2019

(54) FOCUS ADJUSTMENT APPARATUS, CONTROL METHOD FOR FOCUS ADJUSTMENT APPARATUS, AND STORAGE MEDIUM

(71) Applicant: CANON KABUSHIKI KAISHA, Tokyo (JP)

(72) Inventor: Toshihiko Tomosada, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 273 days.

(21) Appl. No.: 14/703,534

(22) Filed: May 4, 2015

(65) Prior Publication Data

US 2015/0323760 A1 Nov. 12, 2015

(30) Foreign Application Priority Data

May 7, 2014 (JP) ................................. 2014-096146

(51) Int. Cl.
| | | |
|---|---|---|
| *G01J 1/20* | (2006.01) | |
| *G02B 7/28* | (2006.01) | |
| *H04N 5/232* | (2006.01) | |
| *G03B 3/10* | (2006.01) | |

(52) U.S. Cl.
CPC ........... *G02B 7/28* (2013.01); *H04N 5/23212* (2013.01); *H04N 5/232133* (2018.08); *G03B 3/10* (2013.01)

(58) Field of Classification Search
CPC ... G02B 7/28; G02B 7/34; G02B 7/09; G02B 7/285; G02B 7/287; G02B 7/04; H04N 5/23212; H04N 5/232133; G03B 3/02; G03B 3/10; G03B 3/13; G03B 13/34; G03B 13/36

USPC ...................................................... 250/201.1
See application file for complete search history.

(56) References Cited

U.S. PATENT DOCUMENTS

| | | | | |
|---|---|---|---|---|
| 2006/0104624 A1* | 5/2006 | Nakata | ...................... | G02B 7/04 396/137 |
| 2010/0171871 A1* | 7/2010 | Ogino | ..................... | G03B 13/36 348/349 |
| 2011/0229052 A1* | 9/2011 | Li | ........................... | G06T 5/002 382/264 |
| 2012/0188408 A1* | 7/2012 | Nakaoka | .................. | G02B 7/28 348/231.99 |

(Continued)

FOREIGN PATENT DOCUMENTS

JP 2003-241077 A 8/2003

*Primary Examiner* — Georgia Y Epps
*Assistant Examiner* — Kevin Wyatt
(74) *Attorney, Agent, or Firm* — Canon USA Inc., IP Division

(57) ABSTRACT

A focus adjustment apparatus includes an imaging unit, a focus detection unit configured to detect a focusing state based on a signal output from the imaging unit, a determination unit configured to determine whether an in-focus position is present within a predetermined range from a current position of a focus lens based on the detected focusing state, a control unit configured to perform control to correct the position of the focus lens moved by a manual operation according to a result of the determination made by the determination unit, and an acquisition unit configured to acquire from a storage unit a movement speed of the focus lens corresponding to the manual operation, wherein the control unit performs control to move the focus lens at a speed determined based on the movement speed acquired from the storage unit.

16 Claims, 15 Drawing Sheets

(56) References Cited

U.S. PATENT DOCUMENTS

| | | | | |
|---|---|---|---|---|
| 2012/0268647 A1* | 10/2012 | Nakagawa | ......... | H04N 5/23212 348/349 |
| 2012/0327274 A1* | 12/2012 | Taguchi | ................ | H04N 5/232 348/240.2 |
| 2013/0010179 A1* | 1/2013 | Takahara | ................ | G02B 7/36 348/353 |

* cited by examiner

PLAN VIEW a-a SECTIONAL VIEW

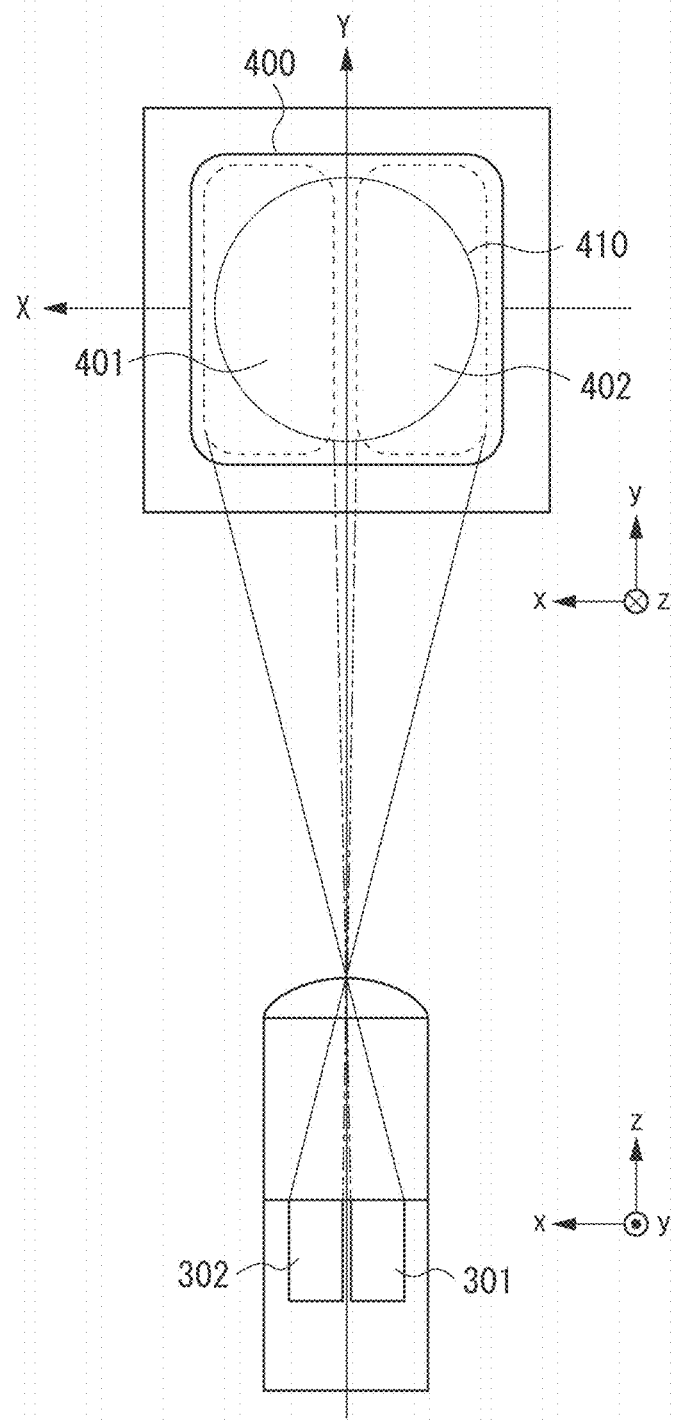

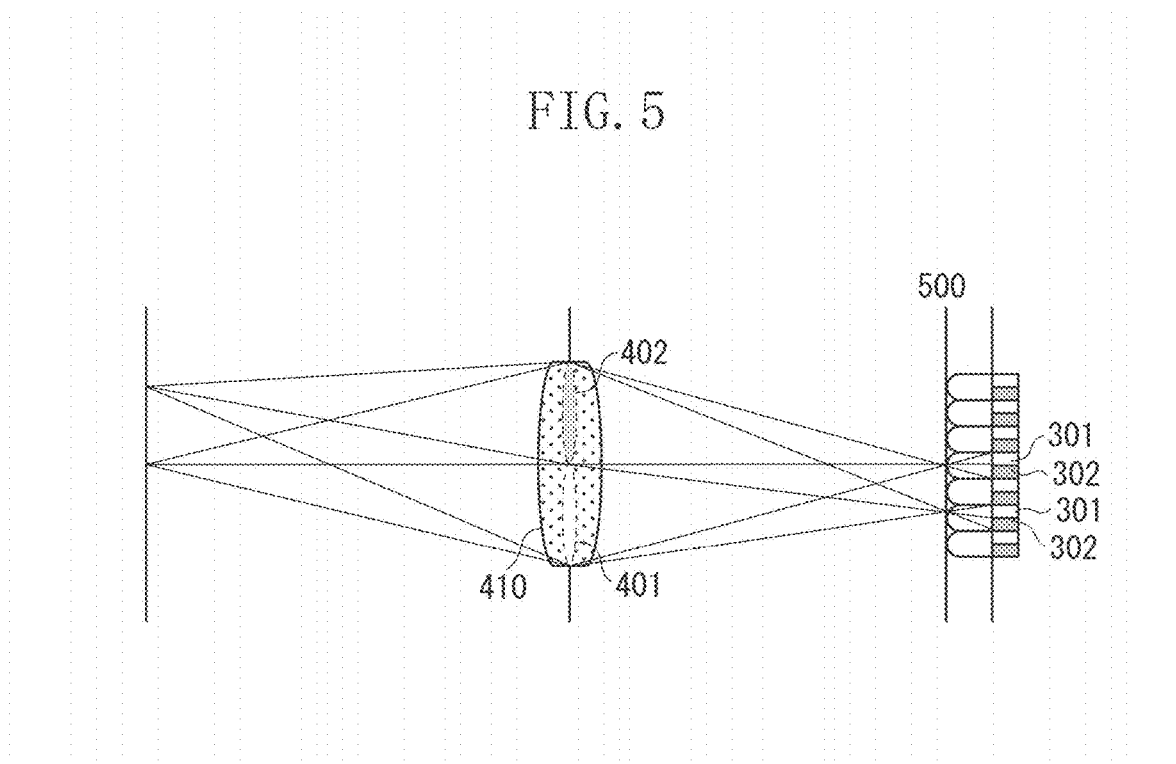

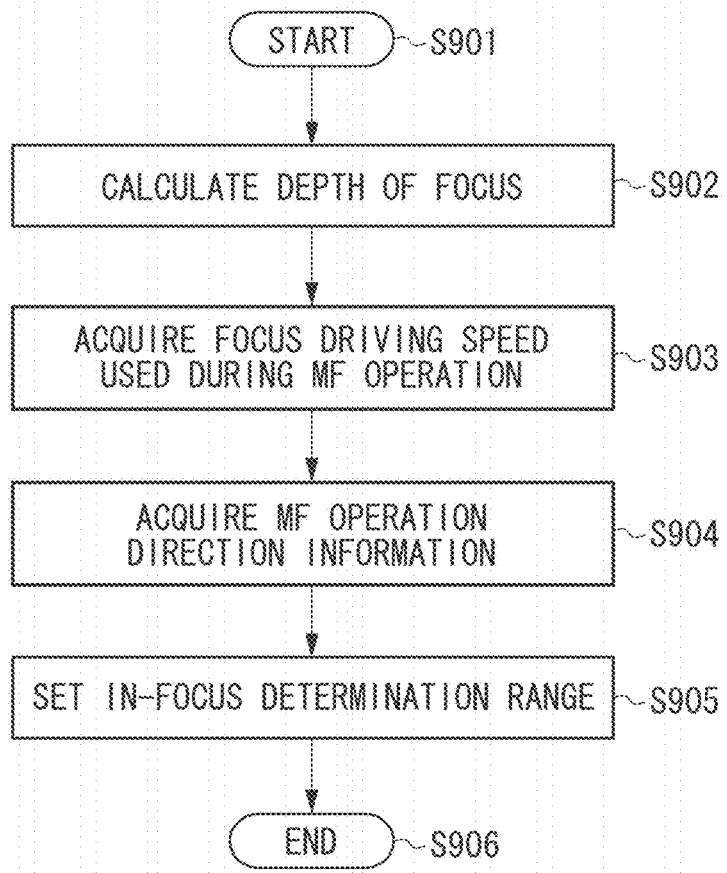

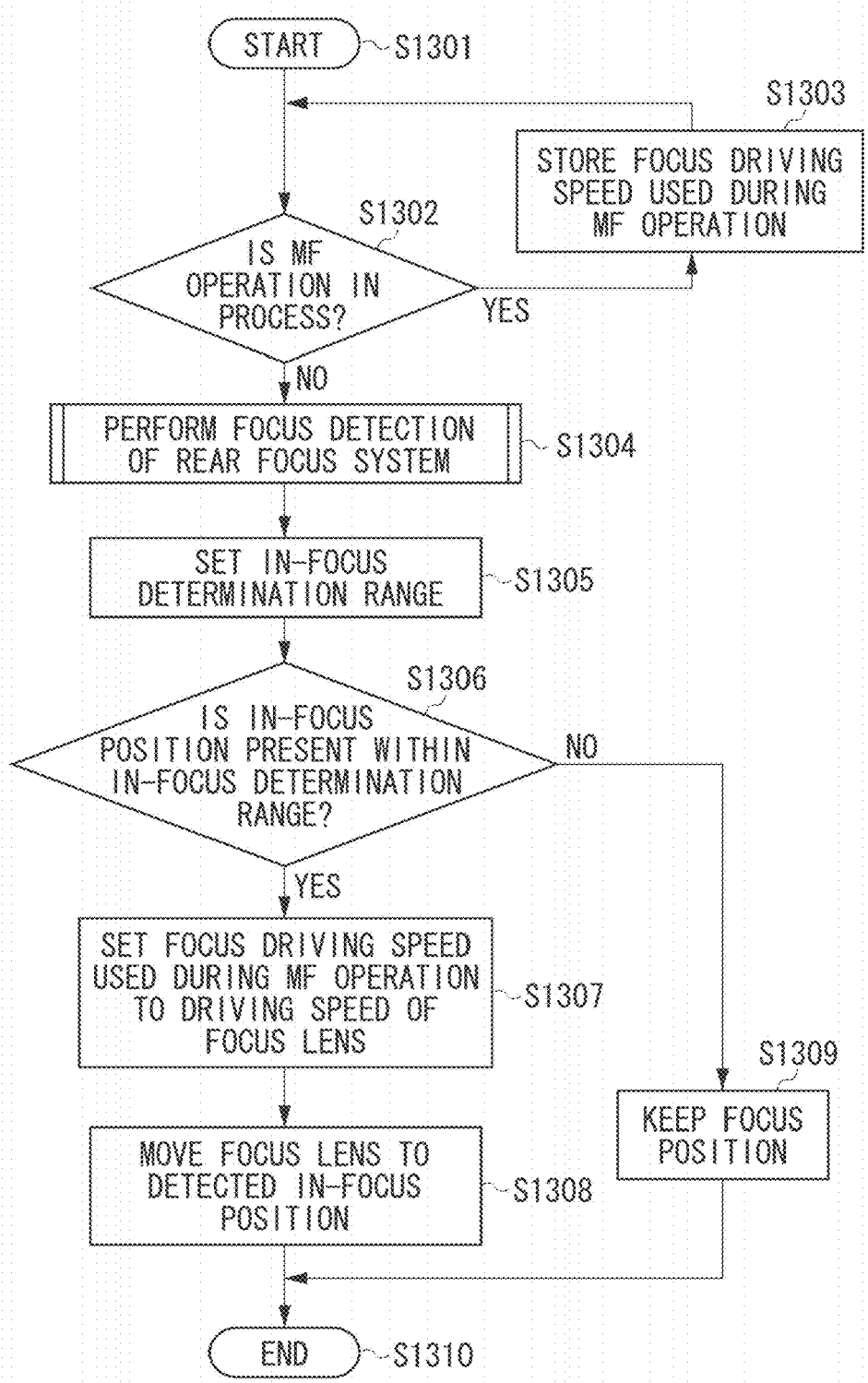

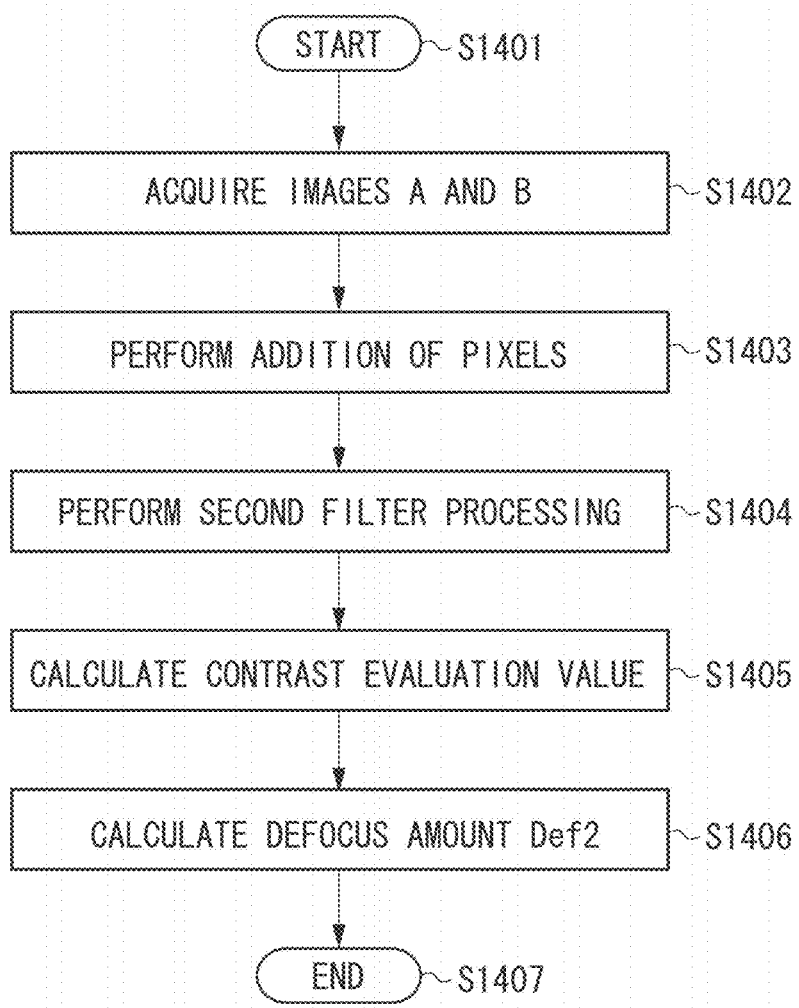

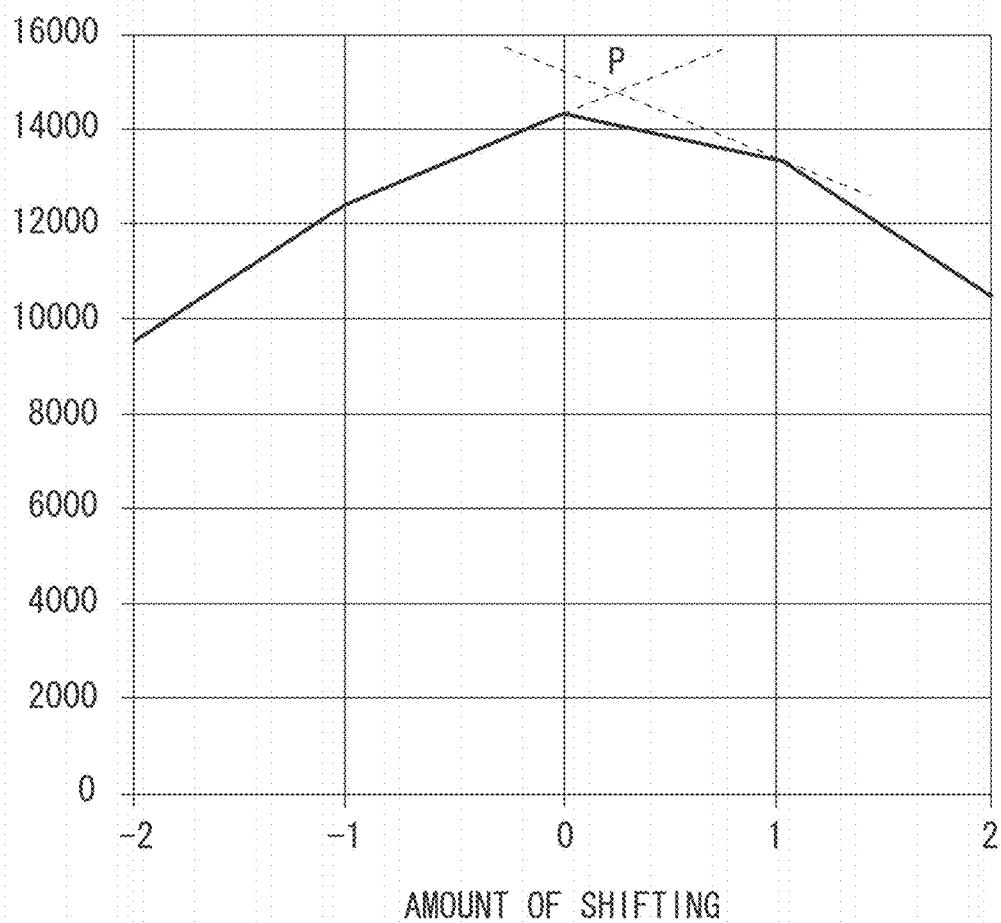

FOCUS ADJUSTMENT APPARATUS, CONTROL METHOD FOR FOCUS ADJUSTMENT APPARATUS, AND STORAGE MEDIUM

BACKGROUND OF THE INVENTION

Field of the Invention

The present invention relates to a focus adjustment apparatus having a function of performing focus adjustment by a manual focusing operation (MF function) and a function of performing focus adjustment by an automatic action (AF function).

Description of the Related Art

In conventional focus adjustment apparatuses for high-definition (HD) video cameras conforming to high-definition television or the like, when the operator intends to focus on an object by a manual focusing operation (MF operation), it is not easy to perform accurate focus adjustment. In particular, when the operator performs focus adjustment while checking focus adjustment with a viewfinder or display panel, a deviation in focus may occur to an extent that focusing cannot be checked via the viewfinder or display panel. Therefore, there was proposed, to correct for a deviation in focus, an MF assistance method of performing an automatic focusing (AF) action after an MF operation is performed. Japanese Patent Application Laid-Open No. 2003-241077 discusses a method of, after having detected the end of an MF operation or the press of a release button or AF switch, performing focus adjustment by AF only once within a limited range, to drive a focus lens to a detailed in-focus position.

In the method discussed in Japanese Patent Application Laid-Open No. 2003-241077, in order to detect a focus position where the contrast value of an object (called an "AF evaluation value") becomes maximum, the focus lens is driven in such a way as to move beyond an in-focus position. Therefore, particularly in the case where a moving image is being captured, an AF action even within a limited range may lead to an instantaneously blurred video image being recorded.

Furthermore, in the process of capturing a moving image, it is desirable that a change in focus that occurs due to the movement of the focus lens by an MF operation and the movement of the focus lens by an AF action after the MF operation is smooth without sudden changes. However, in the method discussed in Japanese Patent Application Laid-Open No. 2003-241077, the speeds of movement of the focus lens before and after the MF operation shifts to the AF action are not taken into consideration, so that a change in focus may not be smooth.

SUMMARY OF THE INVENTION

The present invention is directed to a focus adjustment apparatus capable of performing highly accurate and smooth focusing operations when performing focus adjustment using both an MF function and an AF function.

According to an aspect of the present invention, a focus adjustment apparatus includes an imaging unit configured to photoelectrically convert light that has passed through an imaging optical system including a focus lens into an electrical signal, wherein the focus lens is configured to be moved according to an instruction for a manual operation, a focus detection unit configured to detect a focusing state based on a signal output from the imaging unit, a determination unit configured to make a determination of whether an in-focus position is present within a predetermined range from a current position of the focus lens based on the focusing state detected by the focus detection unit, a control unit configured to perform control to correct the position of the focus lens moved by the manual operation according to a result of the determination made by the determination unit, and an acquisition unit configured to acquire from a storage unit a movement speed of the focus lens corresponding to the manual operation, wherein the control unit performs control to move the focus lens at a speed determined based on the movement speed acquired from the storage unit.

Further features of the present invention will become apparent from the following description of exemplary embodiments with reference to the attached drawings.

BRIEF DESCRIPTION OF THE DRAWINGS

FIG. 4 illustrates a correspondence relationship between a pixel of the image sensor used in the video camera and pupil-divided regions according to the first exemplary embodiment.

FIG. 5 illustrates the pupil division in an imaging optical system and the image sensor used in the video camera according to the first exemplary embodiment.

FIG. 9 is a flowchart illustrating in-focus determination range setting processing according to the first exemplary embodiment.

FIG. 13 is a flowchart illustrating processing performed by a camera microcomputer according to the second exemplary embodiment.

FIG. 14 is a flowchart illustrating in-focus position detection processing performed using a refocus method according to the second exemplary embodiment.

FIG. 15 illustrates an example of contrast evaluation values according to the second exemplary embodiment.

DESCRIPTION OF THE EMBODIMENTS

Figure 1:
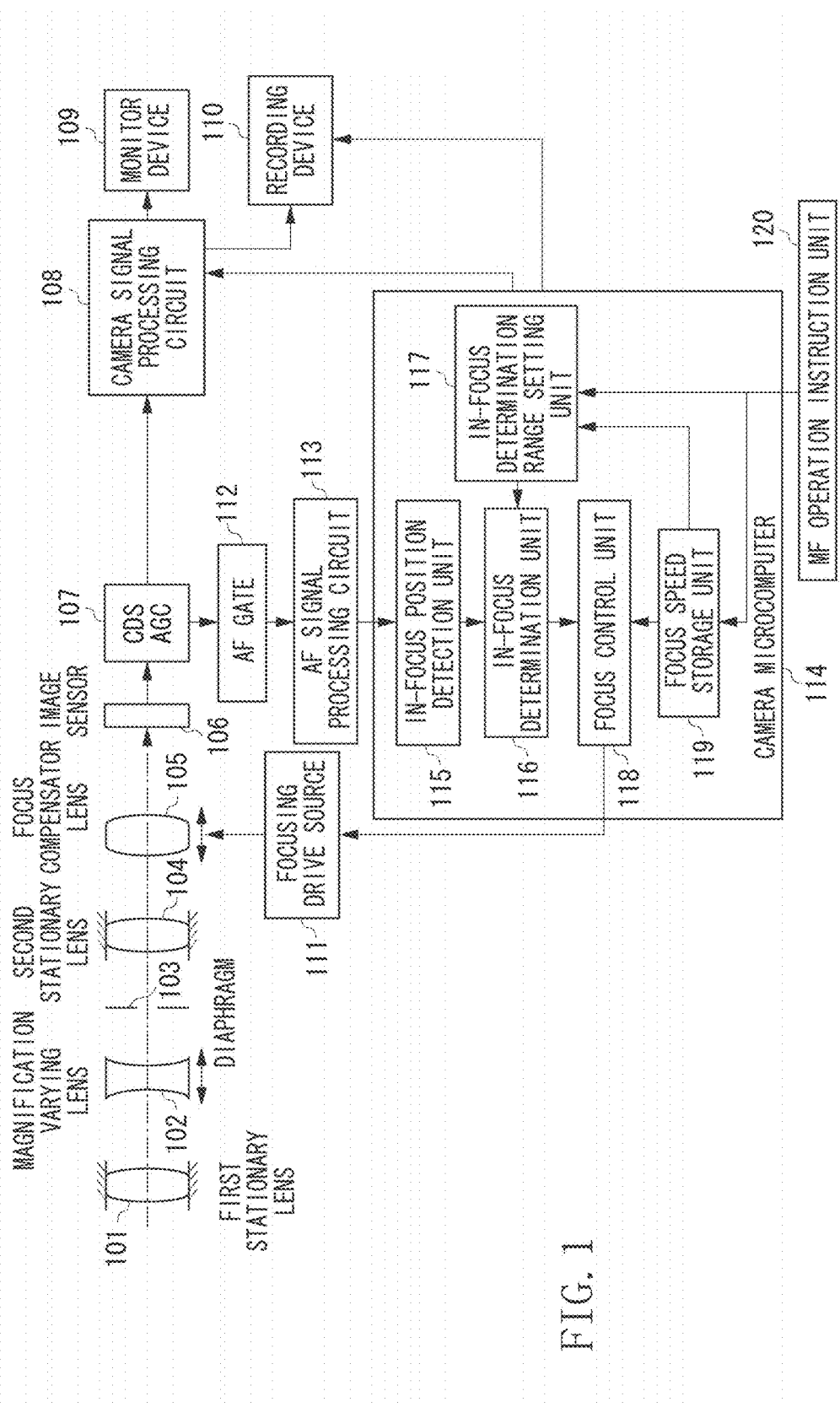
FIG. 1 is a block diagram illustrating a configuration of a video camera including a focus adjustment apparatus according to a first exemplary embodiment.

A first exemplary embodiment of the present invention is described below. FIG. 1 illustrates a configuration of a video camera (an imaging apparatus) including a focus adjustment apparatus according to the first exemplary embodiment. The present exemplary embodiment is directed to an imaging apparatus that includes an image sensor equipped with a plurality of photoelectric conversion elements (pixels) under a single micro-lens, as described below, and that is capable of performing a focus adjustment action using an imaging-plane phase difference method. The imaging apparatus according to the present exemplary embodiment corrects a deviation in focus after the end of an MF operation by performing a focus adjustment action using the imaging-plane phase difference method based on a focus driving speed used during the MF operation. While the present exemplary embodiment is particularly directed to a video camera serving as an example of the imaging apparatus, the present exemplary embodiment can also be applied to other types of imaging apparatuses, such as a digital still camera.

Referring to FIG. 1, an imaging optical system for forming an image from light coming from an object is composed of a first stationary lens 101, a magnification varying lens 102, a diaphragm 103, a second stationary lens 104, and a focus compensator lens (hereinafter referred to as a "focus lens") 105. The magnification varying lens 102 is movable along the optical axis to perform a magnification varying action. The focus lens 105 has both a function of compensating for the movement of a focal plane caused by variation of magnification and a function of adjusting focus.

An image sensor 106, which serves as a photoelectric conversion element, is composed of a charge-coupled device (CCD) sensor or a complementary metal-oxide semiconductor (CMOS) sensor and peripheral circuitry, and is configured to output an electrical signal by photoelectrically converting an image formed from light having passed through the imaging optical system.

Figure 2:
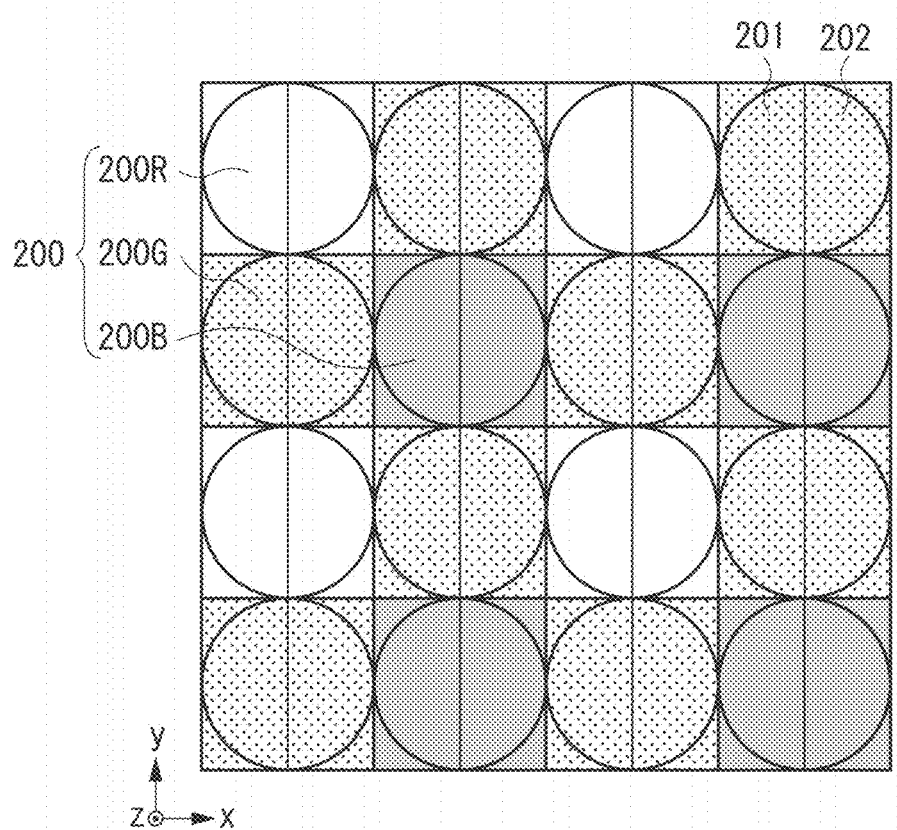
FIG. 2 is a schematic diagram illustrating the pixel array of an image sensor used in the video camera according to the first exemplary embodiment.

FIG. 2 is a schematic diagram of a pixel array of the image sensor 106, which is included in the imaging apparatus according to the present exemplary embodiment. FIG. 2 illustrates an example of the pixel array of a two-dimensional CMOS sensor, serving as the image sensor 106 according to the present exemplary embodiment. For the sake of illustration, the pixel array in FIG. 2 shows only a range of four columns by four rows of imaging pixels (equivalent to a range of eight columns by eight rows of focus detection pixels). In the present exemplary embodiment, a pixel group 200 of two columns by two rows of focus detection pixels is illustrated in the upper left quarter of FIG. 2. The pixel group 200 includes a pixel 200R having spectral sensitivity to red light (R), which is located at the upper left corner, pixels 200G having spectral sensitivity to green light (G), which are located diagonally at the upper right and the lower left corners, and a pixel 200B having spectral sensitivity to blue light (B), which is located at the lower right corner of the pixel group 200. Furthermore, each of pixels 200R, 200G and 200G is composed of a first focus detection pixel 201 and a second focus detection pixel 202, which are arranged in the form of two columns by one row. The image sensor 106 includes a large number of sets of four columns by four rows of imaging pixels (eight columns by eight rows of focus detection pixels), as those illustrated in FIG. 2, and is thus capable of acquiring both a captured image signal and a focus detection signal.

Figure 3A:
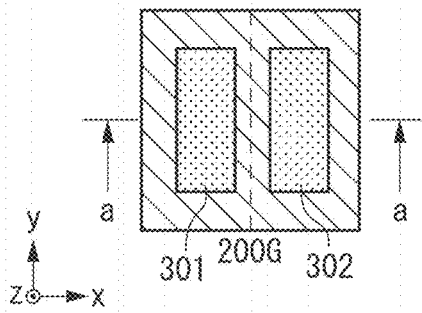
FIGS. 3A and 3B are a schematic plan view and a schematic sectional view, respectively, illustrating the pixel structure of the image sensor used in the video camera according to the first exemplary embodiment.
Figure 3B:
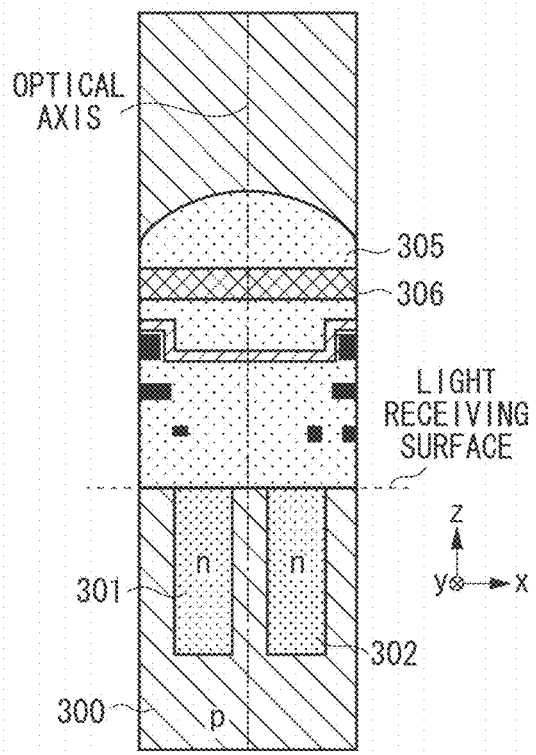

FIG. 3A is a plan view of one pixel out of the pixel group 200. Specifically, in FIG. 3A, one of the pixels 200G of the image sensor illustrated in FIG. 2, as viewed from the light receiving surface side (+z side) of the image sensor, is shown. FIG. 3B is a sectional view of the pixel 200G taken along the line a-a of FIG. 3A, as viewed from the −y side.

As illustrated in FIGS. 3A and 3B, in the pixel 200G according to the present exemplary embodiment, a micro-lens 305 is formed on the light receiving surface side of each pixel, and a photoelectric conversion portion 301 and a photoelectric conversion portion 302 are formed in such a manner as to be divided into NH (divided into two) in the x direction and to be divided into NV (divided into one) in the y direction. The photoelectric conversion portion 301 and the photoelectric conversion portion 302 correspond to the first focus detection pixel 201 and the second focus detection pixel 202, respectively. In each pixel, a color filter 306 is formed between the micro-lens 305 and the photoelectric conversion portions 301 and 302. Furthermore, where appropriate, the spectral transmittance of a color filter may be varied for each photoelectric conversion portion or a color filter may be omitted.

Light incident on the pixel 200G, illustrated in FIGS. 3A and 3B, is converged by the micro-lens 305, is then filtered by the color filter 306 for respective wavelength ranges, and is then received by the photoelectric conversion portion 301 and the photoelectric conversion portion 302. In the photoelectric conversion portion 301 and the photoelectric conversion portion 302, electron-hole pairs are generated by photoelectric conversion according to the amount of received light, and electrons and holes are separated by a depletion layer. Then, electrons with negative charge are accumulated in the n-type layers (not illustrated). On the other hand, the holes are discharged to the outside of the image sensor through the p-type layers 300 connected to a constant voltage source (not illustrated). The electrons accumulated in n-type layers (not illustrated) of the photoelectric conversion portion 301 and the photoelectric conversion portion 302 are transferred to an electrostatic capacitance portion (floating diffusion (FD)) (not illustrated) via a transfer gate, and are then converted into a voltage signal (electric signal), which is then output as a pixel signal.

FIG. 4 illustrates a correspondence relationship between the pixel structure, illustrated in FIGS. 3A and 3B according to the present exemplary embodiment, and the pupil division. More specifically, FIG. 4 illustrates a sectional view of the pixel structure, illustrated in FIG. 3A according to the present exemplary embodiment, taken along the line a-a as viewed from the +y side and the exit pupil plane of the imaging optical system. In FIG. 4, for the purpose of showing a correspondence with the coordinate axes of the exit pupil plane, the x axis and the y axis of the sectional view are inverted with respect to those illustrated in FIGS. 3A and 3B. In FIG. 4, the elements similar to those illustrated in FIGS. 3A and 3B are assigned the respective same reference numerals.

As illustrated in FIG. 4, a first pupil partial region 401 of the first focus detection pixel 201 is made by the micro-lens 306 to be almost in a conjugate relation with the light receiving surface of the photoelectric conversion portion 301, the center of mass of which is deviated in the −x direction, and represents a pupil region through which the first photoelectric conversion portion 201 is able to receive light. The center of mass of the first pupil partial region 401 of the first focus detection pixel 201 is deviated in the +x direction on the pupil plane. In FIG. 4, a second pupil partial region 402 of the second focus detection pixel 202 is made by the micro-lens 306 to be almost in a conjugate relation with the light receiving surface of the photoelectric conversion portion 302, the center of mass of which is deviated in the +x direction, and represents a pupil region through which the second photoelectric conversion portion 202 is able to receive light. The center of mass of the second pupil partial region 402 of the second focus detection pixel 202 is deviated in the −x direction on the pupil plane. Furthermore, in FIG. 4, a pupil region 400 represents a pupil region through which the entire pixel 200G is able to receive light with the photoelectric conversion portion 301 and the photoelectric conversion portion 302 (the first focus detection pixel 201 and the second focus detection pixel 202) combined.

FIG. 5 is a schematic view illustrating a correspondence relationship between the image sensor and the pupil division made by the micro-lens (pupil division unit) according to the present exemplary embodiment. Light fluxes having passed through different pupil partial regions, i.e., the first pupil partial region 401 and the second pupil partial region 402, of the exit pupil 410 fall on the respective pixels of the image sensor at the respective different angles, and are then received by the first focus detection pixel 201 and the second focus detection pixel 201, which are arranged in the form of two columns by one row. Furthermore, while, in the present exemplary embodiment, an example in which the pupil region is divided into two pupil partial regions in the horizontal direction is described, the pupil region may be divided in the vertical direction as appropriate.

As described above, an image sensor employed in the present exemplary embodiment includes a first focus detection pixel configured to receive a light flux having passed through a first pupil partial region of an imaging optical system and a second focus detection pixel configured to receive a light flux having passed through a second pupil partial region of the imaging optical system, which is different from the first pupil partial region. Furthermore, the image sensor further includes an array of imaging pixels configured to receive a light flux having passed through a pupil region that is a combination of the first pupil partial region and the second pupil partial region of the imaging optical system. In the image sensor according to the present exemplary embodiment, each imaging pixel is composed of the first focus detection pixel and the second focus detection pixel. However, where appropriate, the imaging pixel, the first focus detection pixel, and the second focus detection pixel may be configured to be individual pixels, and the first focus detection pixel and the second focus detection pixel may be partially arranged in a part of the array of imaging pixels.

The present exemplary embodiment is configured to detect a focusing state by generating a first focus detection signal from a received light signal output from the first focus detection pixel 201 of each pixel of the image sensor and generating a second focus detection signal from a received light signal output from the second focus detection pixel 202 of each pixel of the image sensor. Furthermore, the present exemplary embodiment is configured to generate a captured image signal (a captured image) with a resolution of N effective pixels by adding signals of the first focus detection pixel 201 and the second focus detection pixel 202 for each pixel of the image sensor.

A correlated double sampling/automatic gain control (CDS/AGC) circuit 107 samples an output of the image sensor 106 and adjusts the gain thereof. A camera signal processing circuit 108 generates a captured image signal by performing various types of image processing on an output signal of the CDS/AGC circuit 107. A monitor device 109, which is composed of a liquid crystal display or the like, displays a captured image signal output from the camera signal processing circuit 108 as well as information about shooting modes of the camera, an in-focus state indication image during focus detection, etc. A recording device 110 records a captured image signal output from the camera signal processing circuit 108 on a recording medium, such as a magnetic tape, an optical disc, and a semiconductor memory.

A focusing drive source 111 is a drive source for moving the focus lens 105 along the optical axis for focus adjustment, and is composed of an actuator, such as a stepping motor, a direct current (DC) motor, a vibration-type motor, and a voice coil motor.

An AF gate 112 passes a first focus detection signal and a second focus detection signal corresponding to areas used for focus detection (focus detection areas) among output signals of the all pixels from the CDS/AGC circuit 107. An AF signal processing circuit 113 performs correlation computation based on the focus detection signals having passed through the AF gate 112, to calculate an image deviation amount (deviation amount) and reliability information (such as the degree of coincidence between two images, the degree of steepness between two images, contrast information, saturation information, and flaw information). Then, the AF signal processing circuit 113 outputs the calculated image deviation amount and reliability information to an in-focus position detection unit 115, which is included in a camera microcomputer 114. The camera microcomputer 114 includes, besides the in-focus position detection unit 115, an in-focus determination unit 116, an in-focus determination range setting unit 117, a focus control unit 118, and a focus speed storage unit 119, which are described below. The in-focus position detection unit 115, using a focus detection method of the phase-difference system, which is described below, calculates the amount of deviation from an in-focus state of the imaging position corresponding to the current focus position on the imaging plane, called a "defocus amount", based on the image deviation amount calculated by the AF signal processing circuit 113. The in-focus position detection unit 115 outputs the calculated defocus amount to the in-focus determination unit 116.

Figure 6:
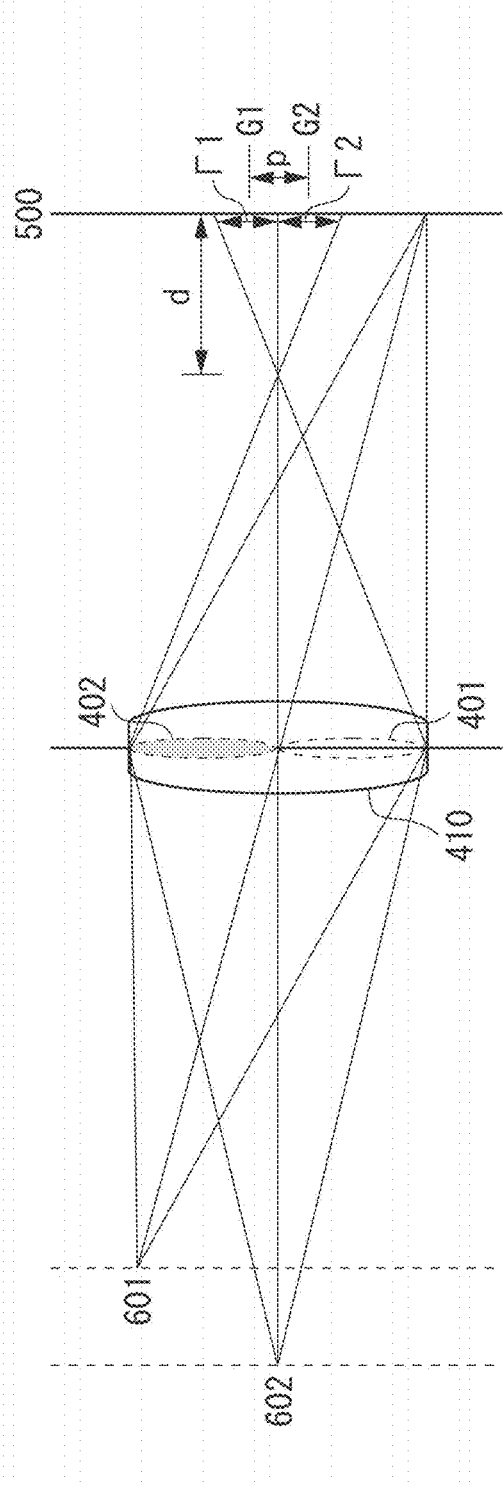
FIG. 6 illustrates a relationship between the defocus amount and the image deviation amount of an image calculated based on a first focus detection signal and a second focus detection signal generated from pixel signals output from the image sensor used in the video camera according to the first exemplary embodiment.

Here, the relationship between an image deviation amount and a defocus amount in a pair of image signals (the first focus detection signal and the second focus detection signal) acquired by the image sensor used in the present exemplary embodiment is described. FIG. 6 illustrates a relationship between a defocus amount of the first focus detection signal and the second focus detection signal and an image deviation amount obtained between the first focus detection signal and the second focus detection signal. The image sensor (not illustrated in FIG. 6) used in the present exemplary embodiment is located at an imaging plane 500, and the exit pupil of the imaging optical system is divided into two regions, i.e., the first pupil partial region 401 and the second pupil partial region 402, like those illustrated in FIGS. 4 and 5. In FIG. 6, the elements similar to those illustrated in FIGS. 4 and 5 are assigned the respective same reference numerals.

When it is supposed that the distance from the image-forming position of an object to the imaging plane 500 is a magnitude |d|, the defocus amount d is defined as being negative (d<0) in the case of a near focus state, in which the image-forming position of the object is located nearer to the object than the imaging plane 500, and as being positive (d>0) in the case of a far focus state, in which the image-forming position of the object is located farther from the object than the imaging plane 500. In the case of an in-focus state, in which the image-forming position of the object is located at the imaging plane 500 (an in-focus position), the defocus amount d is zero (d=0) with a minor tolerance to account for minor inaccuracies. Referring to FIG. 6, the location of an object 601 indicates an example in which an in-focus state (d=0) is obtained. The location of an object 602 indicates an example in which a near-focus state (d<0) is obtained. A near-focus state (d<0) and a far-focus state (d>0) are collectively referred to as a "defocus state" (|d|>0).

In the near-focus state (d<0), object light having passed through the first pupil partial region 401, among light fluxes coming from the object 602, is once converged and is then spread to a width Γ1 centering on the center-of-mass position G1 of the light flux, thus forming a blurred image on the imaging plane 500. The same is true of object light having passed through the second pupil partial region 402, which forms a blurred image spread to a width Γ2 centering on the center-of-mass position G2 of the light flux. The blurred image is received by the first focus detection pixel 201 (the second focus detection pixel 202), which constitutes each pixel arrayed in the image sensor, so that the first focus detection signal (the second focus detection signal) is generated. Accordingly, the first focus detection signal (the second focus detection signal) is recorded as an object image which is an image of the object 602 blurred at the width Γ1 (Γ2) centering on the center-of-mass position G1 (G2) on the imaging plane 500. The width Γ1 (Γ2) of blurring of the object image almost proportionally increases as the magnitude |d| of the defocus amount d increases. Similarly, the magnitude |p| of the image deviation amount p between object images represented by the first focus detection signal and the second focus detection signal also almost proportionally increases as the magnitude |d| of the defocus amount d increases. The same is true of the far-focus state (d>0), in which, however, the direction of image deviation between object images represented by the first focus detection signal and the second focus detection signal is opposite to that in the near-focus state.

Accordingly, as the magnitude of the defocus amount of each of the first focus detection signal and the second focus detection signal or the defocus amount of a captured image signal obtained by adding the first focus detection signal and the second focus detection signal increases, the magnitude of the image deviation amount between the first focus detection signal and the second focus detection signal increases.

The present exemplary embodiment is configured to perform focus detection of the phase difference system using the above-described correlation between the defocus amount and the image deviation amount of the first focus detection signal and the second focus detection signal. The focus detection of the phase difference system includes calculating the amount of correlation indicating the degree of coincidence of signals while relatively shifting the first focus detection signal and the second focus detection signal, and detecting the image deviation amount based on the amount of shifting that maximizes the correlation (degree of coincidence). Then, the focus detection of the phase difference system includes converting the image deviation amount into a detected defocus amount based on such a correlation that, as the magnitude of the defocus amount increases, the magnitude of the image deviation amount between the first focus detection signal and the second focus detection signal increases, thus performing focus detection.

The in-focus determination unit 116 determines whether an in-focus position is present within an in-focus determination range set by the in-focus determination range setting unit 117, and inputs a result of the determination to the focus control unit 118. The method for setting the in-focus determination range is described below.

When it is determined by the in-focus determination unit 116 that an in-focus position is present, the focus control unit 118 converts the defocus amount calculated by the in-focus position detection unit 115 into a driving amount for the focus lens 105, and controls the focusing drive source 111 to move the focus lens 105. The focus speed storage unit 119 stores a driving speed of the focus lens 105 in process of a manual focusing (MF) operation according to an operation instruction from an MF operation instruction unit 120, which is described below. The focus control unit 118 controls the focusing drive source 111 based on the driving speed stored in the focus speed storage unit 119 to move the focus lens 105. In the present exemplary embodiment, it is supposed that the focus speed storage unit 119 stores a history of speeds in process of MF operations for a predetermined time, calculates an average speed from the stored speeds, and inputs the average speed to the focus control unit 118. However, the focus speed storage unit 119 may store a focus speed detected immediately before the end of an MF operation.

The MF operation instruction unit 120, which serves as a manual adjustment unit, is composed of a ring member and a sensor, which detects the direction of rotation or the amount of rotation per unit time of the ring member, or is composed of a key or button member and a switch member, which detects whether the key or button member is pressed. The MF operation instruction unit 120 determines whether an MF operation (manual operation) is being performed, based on a signal output from the sensor or switch member, and issues an instruction as to whether to drive the focus lens 105 toward the closest distance side or to drive the focus lens 105 toward the infinite distance side.

Figure 7:
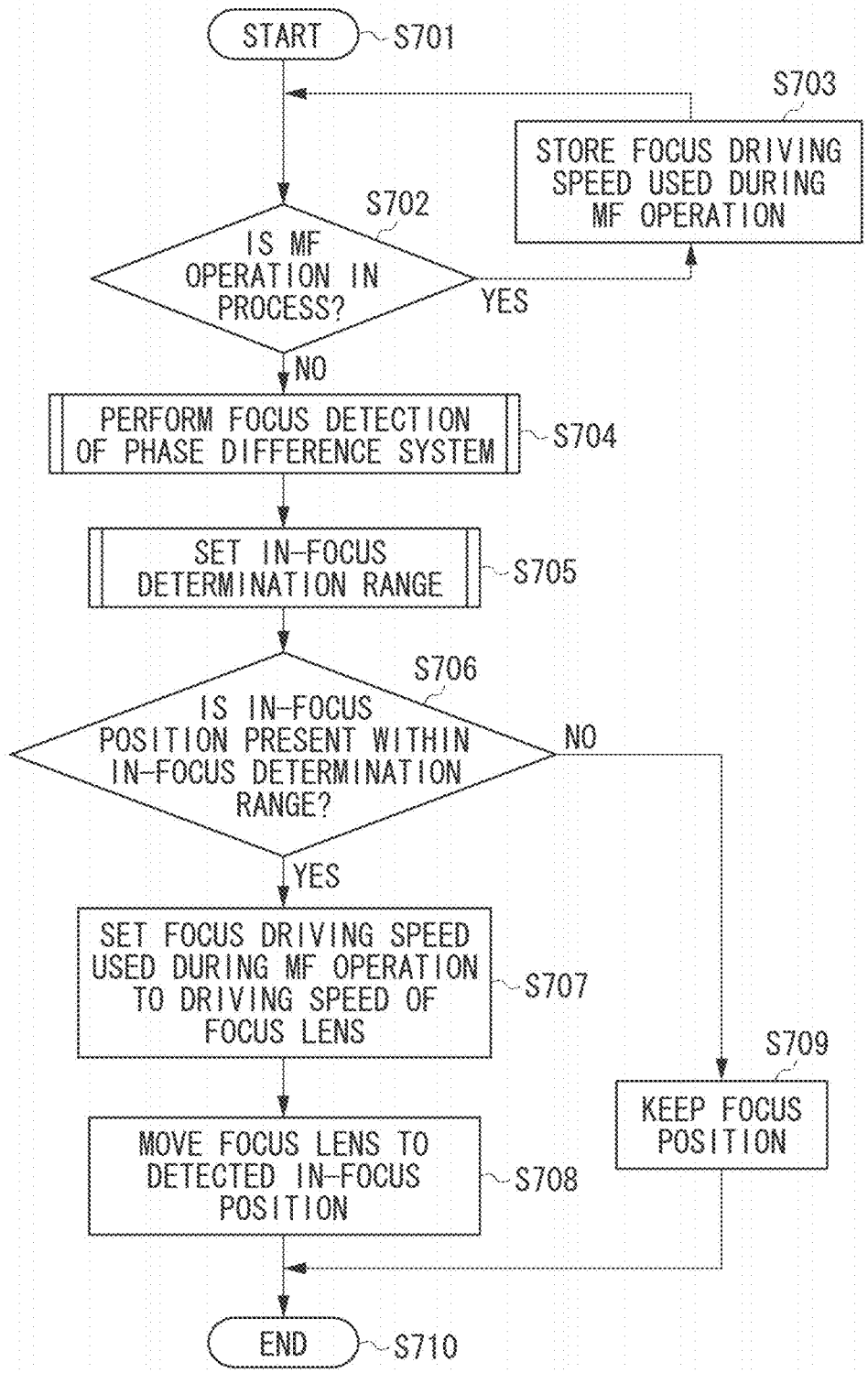
FIG. 7 is a flowchart illustrating processing performed by a camera microcomputer according to the first exemplary embodiment.

Next, the flow of the entire processing performed according to the present exemplary embodiment is described with reference to FIG. 7. FIG. 7 is a flowchart illustrating the flow of a series of processing operations performed up to, after an MF operation, driving the focus lens 105 to an in-focus position detected by the above-described focus detection of the phase difference system based on the focus driving speed used during the MF operation. The series of processing operations is executed according to a computer program stored in the camera microcomputer 114.

A series of processing operations in steps S701 to S709 performs control to correct and move the focus lens 105 to an in-focus position at a focus driving speed used during an MF operation when the in-focus position is located near the position of the focus lens 105 at the time of the end of the MF operation. The series of processing operations is described below in detail.

In step S701, the processing starts. In step S702, the camera microcomputer 114 determines whether an MF operation is in process, based on an input signal from the MF operation instruction unit 120. If it is determined that an MF operation is in process (YES in step S702), the processing proceeds to step S703. If it is determined that no MF operation is in process (NO in step S702), the processing proceeds to step S704.

In step S703, which is executed as long as an MF operation is in process, the camera microcomputer 114 stores in the focus speed storage unit 119 a focus driving speed used during the MF operation. More specifically, in the present exemplary embodiment, the camera microcomputer 114 stores, into a memory region thereof, focus driving speeds for a predetermined time, calculates an average speed of the focus driving speeds obtained for the predetermined time, and stores the calculated average speed into the focus speed storage unit 119. For example, in the case of an MF operation using a rotary member, such as a ring member, it is difficult to keep a manual rotation speed constant, so that, even if the operator's intention is to be rotating the rotary member at a constant speed, the focus driving speed may become uneven. Therefore, the above-described time-averaging of focus driving speeds enables storing a focus driving speed at which the operator intends to rotate the rotary member.

In step S704, the camera microcomputer 114 performs focus detection of the phase difference system. The flow of processing for a focus detecting operation of the phase difference system according to the present exemplary embodiment is illustrated in FIG. 8.

Figure 8:
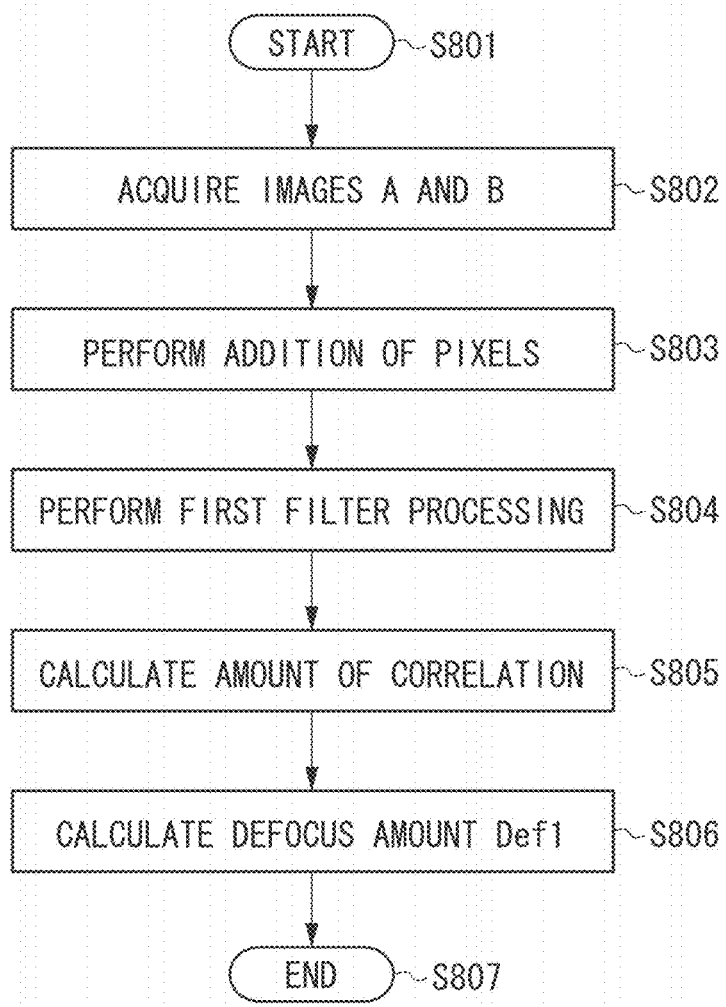
FIG. 8 is a flowchart illustrating in-focus position detection processing performed using a phase difference method according to the first exemplary embodiment.

Referring to FIG. 8, in step S801, the processing starts. In step S802, the camera microcomputer 114 acquires a first focus detection signal (image A) from the received light signal output from the first focus detection pixel in a focus detection area set by the AF gate 112 and acquires a second focus detection signal (image B) from the received light signal output from the second focus detection pixel in the focus detection area.

In step S803, the camera microcomputer 114 performs, via an image processing unit (not illustrated), processing for adding three pixels in the column direction, for the purpose of decreasing the amount of signal data, with respect to each of the first focus detection signal and the second focus detection signal. The camera microcomputer 114 further performs Bayer (RGB) addition processing to convert R, G, and B signals into a luminance Y signal. These two addition processing operations are collectively referred to as "pixel addition processing".

In step S804, the camera microcomputer 114 performs first filter processing on the first focus detection signal and the second focus detection signal. In the present exemplary embodiment, on the assumption that focus detection of the phase difference system is performed starting with a state in which the focus lens 105 has been moved by an MF operation up to a position somewhat near the in-focus position, in other words, a small defocus state in which an in-focus state is almost attained, the pass band of the first filter processing is configured to include a high-frequency band. Where appropriate, when focus detection is performed starting with a large defocus state, the pass band of filter processing at the time of focus detection may be adjusted to a low-frequency band.

Next, in step S805, the camera microcomputer 114 performs shift processing for relatively shifting the first focus detection signal and the second focus detection signal, which has been subjected to the filter processing, in the pupil division direction, and calculates the amount of correlation indicating the degree of coincidence of signals.

Suppose that the k-th first focus detection signal subjected to the filter processing is A(k), the k-th second focus detection signal subjected to the filter processing is B(k), and the range of numbers k corresponding the focus detection area is W. When the amount of shifting used for the shift processing is $s_1$ and the range of shift with the amount of shifting $s_1$ is $\Gamma 1$, the amount of correlation COR is calculated using the following equation (1):

$$COR(s_1) = \sum_{k \in W} |A(k) - B(k - s_1)|, s_1 \in \Gamma 1 \quad (1)$$

The camera microcomputer 114 performs shift processing with the amount of shifting $s_1$ to associate the k-th first focus detection signal A(k) with the (k-$s_1$)th second focus detection signal B(k-$s_1$) and perform subtraction therebetween, thus generating a shift subtraction signal. Then, the camera microcomputer 114 calculates the amount of correlation COR($s_1$) by calculating the absolute value of the generated shift subtraction signal and obtaining the sum of numbers k within the range W corresponding to the focus detection area. Where appropriate, the camera microcomputer 114 may add the amounts of correlation calculated in the respective rows for each amount of shifting over a plurality of rows.

In step S806, the camera microcomputer 114 performs sub-pixel computation based on the calculated amount of correlation to calculate the real-valued amount of shifting causing the amount of correlation to become minimum, and sets the calculated amount of shifting as an image deviation amount p1. Then, the camera microcomputer 114 calculates a detected defocus amount (Def1) by multiplying the image deviation amount p1 by the image height of the focus detection area, the F-number of the imaging lens (imaging optical system), and a conversion coefficient corresponding to the exit pupil distance. Then, in step S807, the processing ends.

As described above, in the present exemplary embodiment, a focus detection unit of the phase difference system calculates the amount of correlation by performing the first filter processing and the shift processing on the first focus detection signal and the second focus detection signal, and detects a defocus amount based on the calculated amount of correlation. Here, as the focus lens 105 is farther from the in-focus position, the defocus amount takes a larger value. The defocus amount taking a value of zero indicates that the focus lens 105 is at the in-focus position. In other words, calculating the position of the focus lens 105 where the defocus amount becomes zero based on the relationship between the position of the focus lens 105 and the defocus amount enables detecting an in-focus position without moving the focus lens 105.

Next, referring back to FIG. 7, in step S705, the camera microcomputer 114 sets an in-focus determination range, which is used, in step S706, to determine whether an in-focus position is present near the focus position at the time of the end of an MF operation.

FIG. 9 illustrates the flow of processing for setting the in-focus determination range according to the present exemplary embodiment. In the present exemplary embodiment, the camera microcomputer 114 performs steps S901 to S906 to set the in-focus determination range according to a focus driving speed and an MF operation direction at the time of an MF operation based on the depth of focus.

In step S901, the processing starts. In step S902, the camera microcomputer 114 calculates the depth of focus based on the acceptable circle of confusion diameter and the F-number, which is determined by the aperture value of the diaphragm 103. The acceptable circle of confusion diameter is determined by the magnitude of one pixel (pixel pitch), which is determined by the magnitude of the image sensor 106 and the number of pixels. The depth of focus is the range of distances for which object points are imaged with acceptable sharpness with a fixed position of the imaging plane. If the image-forming position lies at the position exceeding the depth of focus, a captured image may appear as a blur. However, in a case where the operator checks an in-focus state via a viewfinder or a display panel attached to the camera body, it may be difficult in some cases to recognize the captured image as a blur even if the depth of focus is exceeded. Therefore, even if the operator has intended to adjust focus by an MF operation, there is a possibility that the depth of focus is exceeded. Accordingly, in the present exemplary embodiment, it is supposed that when the operator performs an MF operation to focus on an object, the operator is able to perform visual focus adjustment, for example, up to the vicinity of a position distant three times the one-side depth of focus from the in-focus position, and the criterion for the in-focus determination range is set as three times the one-side depth of focus.

Figure 10A:
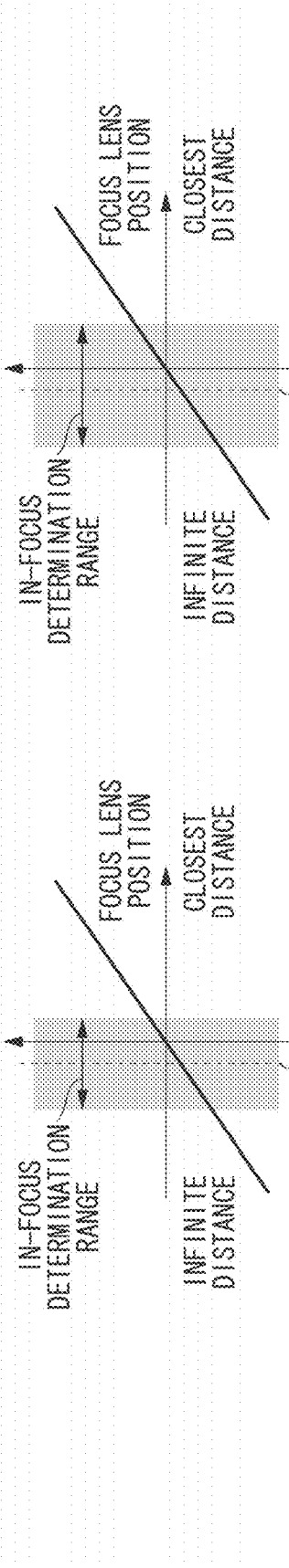
FIGS. 10A, 10B, 10C, and 10D are schematic diagrams illustrating setting of an in-focus determination range according to the first exemplary embodiment.

FIGS. 10A, 10B, 10C, and 10D are schematic diagrams illustrating setting of the in-focus determination range. In FIGS. 10A to 10D, the abscissa axis indicates the focus position (the position of the focus lens 105), and the ordinate axis indicates the defocus amount. Each slant line depicted in FIGS. 10A to 10D indicates that as the focus lens position is farther from the position where the defocus amount becomes zero, i.e., the in-focus position, toward the infinite distance side or toward the closest distance side, the defocus amount becomes proportionally larger. Furthermore, each dashed line indicates the focus position at the time of the end of an MF operation, and each shaded region indicates an in-focus determination range, which is set between the front and rear edges of the region. As illustrated in FIG. 10A, in the present exemplary embodiment, the in-focus determination range is set as a region centering on the focus position at the time of the end of an MF operation and extending toward both the closest distance side and the infinite distance side. Furthermore, in the present exemplary embodiment, the in-focus determination range is set based on the depth of focus. However, this is not restrictive. For example, the in-focus determination range may be set based on the depth of field, or may be individually set according to the object distance or the focal length.

Next, in step S903, the camera microcomputer 114 acquires a focus driving speed used during the MF operation, which has been stored in step S703 illustrated in FIG. 7. Then, the processing proceeds to step S904. In step S904, the camera microcomputer 114 acquires operation direction information indicating whether the focus lens 10 59 is being driven toward the closes distance side or is being driven toward the infinite distance side, based on the rotation direction or instruction information of the MF operation instruction unit 120.

Figure 10B:
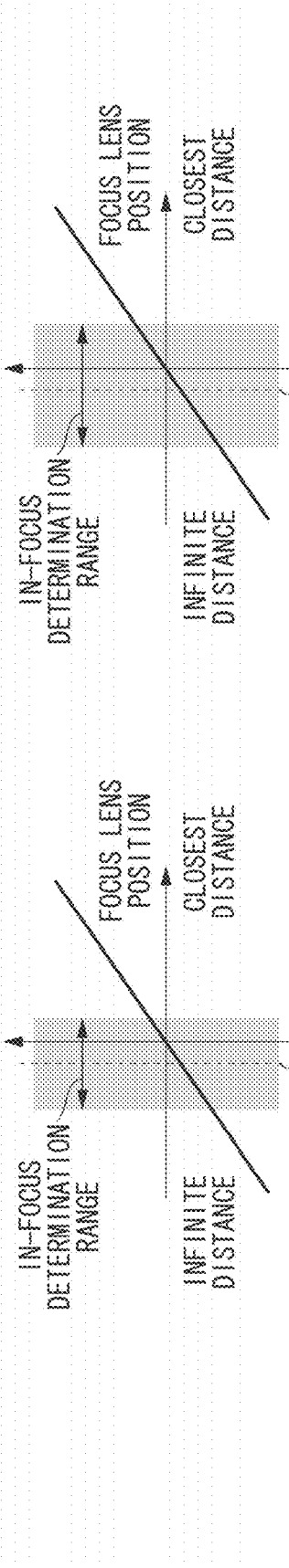

In step S905, the camera microcomputer 114 sets or changes the in-focus determination range (in the present exemplary embodiment, three times the depth of focus), which is determined based on the depth of focus calculated in step S902, according to the focus driving speed used during the MF operation, which has been acquired in step S903, and the MF operation direction information, which has been acquired in step S904. In a case where the focus driving speed used during the MF operation, which has been acquired in step S903, is high, since it is supposed that the operator is performing coarse adjustment, it is estimated that the deviation from the in-focus position becomes relatively large at the time of the end of the MF operation. Accordingly, in the present exemplary embodiment, as illustrated in FIG. 10B, in a case where the focus driving speed used during the MF operation is higher than a first threshold value, the camera microcomputer 114 sets a wide range, which is 1.5 times the standard in-focus determination range. Thus, in the present exemplary embodiment, the camera microcomputer 114 sets the in-focus determination range to a range wide as much as 4.5 times the depth of focus. In this way, in the present exemplary embodiment, in a case where the focus driving speed used during the MF operation is higher than the first threshold value, the camera microcomputer 114 sets a wide in-focus determination range as compared with that in a case where the focus driving speed is equal to or lower than the first threshold value.

Figure 10C:
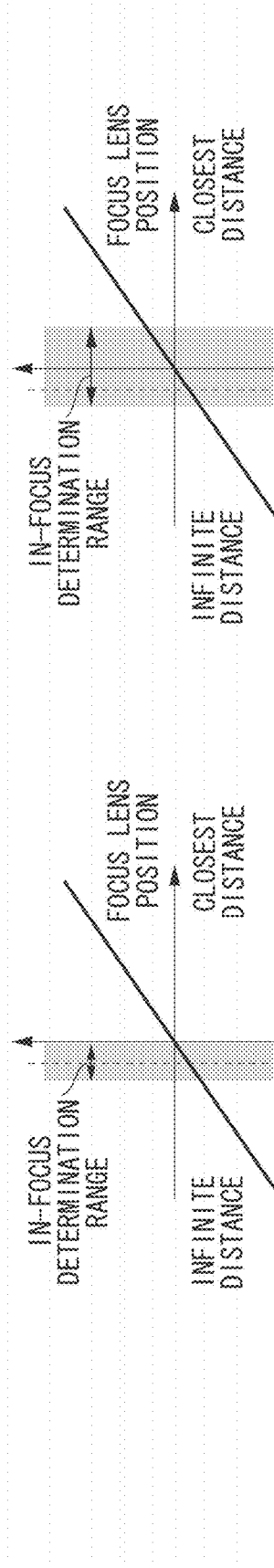

On the other hand, in a case where the focus driving speed used during the MF operation is low, since it is supposed that the operator is performing fine adjustment, it is estimated that the deviation from the in-focus position becomes relatively small at the time of the end of the MF operation. Accordingly, in the present exemplary embodiment, as illustrated in FIG. 10C, in a case where the focus driving speed used during the MF operation is lower than a second threshold value (<the first threshold value), the camera microcomputer 114 sets a narrow range, which is 0.5 times the standard in-focus determination range. Thus, in the present exemplary embodiment, the camera microcomputer 114 sets the in-focus determination range to a range wide as much as 1.5 times the depth of focus. In this way, in the present exemplary embodiment, in a case where the focus driving speed used during the MF operation is lower than the second threshold value, the camera microcomputer 114 sets a narrow in-focus determination range as compared with that in a case where the focus driving speed is equal to or higher than the second threshold value. In this instance, the speed threshold values used for comparison to determine whether the focus driving speed used during the MF operation is high or low may be previously determined based on the relationship between the focus movement amount relative to the focus driving speed and the depth of focus. Alternatively, the speed threshold values may be determined by tuning based on the ease of focus adjustment or operational feeling depending on the load or operation amount of the operation of, for example, a ring member.

Figure 10D:
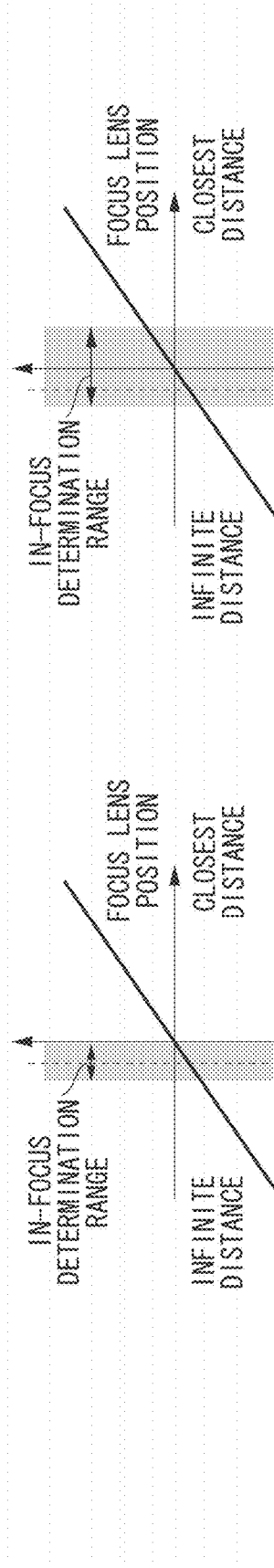

Furthermore, in a case where the MF operation direction information acquired in step S904 indicates the direction of the closest distance side, it is estimated that the operator, while performing focusing from the infinite distance side toward the closest distance side, often ends the MF operation short of the in-focus position, i.e., at a position nearer to the infinite distance side than the in-focus position. Therefore, as illustrated in FIG. 10D, the camera microcomputer 114 sets wide a part of the in-focus detection range nearer to the closest distance side than the focus position located at the time of the end of the MF operation, and sets narrow a part of the in-focus detection range nearer to the infinite distance side than the focus position. In this way, widening the width of a part of the in-focus detection range on the same side as that indicated by the operation direction information makes it easy to perform deviation correction even if the deviation from the in-focus position is large in a case where the MF operation is stopped short of the in-focus position. Furthermore, in a case where the MF operation is stopped past the in-focus position, the focus position can be kept at the position where the MF operation is stopped, without correction of such deviation. This concept is based on the consideration that, while the focus driving in the same direction as the driving direction used during the MF operation appears smooth as visibility of focus, the inversion of driving of the focus lens may cause focusing to appear instantaneously wobbly.

Next, referring back to FIG. 7, in step S706, the camera microcomputer 114 determines whether an in-focus position obtained as a result of detection in step S704 is present within the in-focus determination range set in step S705. If it is determined that the in-focus position is present within the in-focus determination range (YES in step S706), the processing proceeds to step S707. If it is determined that the in-focus position is not present within the in-focus determination range (NO in step S706), then in step S709, the camera microcomputer 114 performs control to keep the focus lens 105 at the current focus position. Then, in step S710, the processing ends.

In the present exemplary embodiment, if a difference between the current focus position located at the time of the end of the MF operation and the detected in-focus position is equal to or less than the width of the in-focus determination range, the camera microcomputer 114 determines that the in-focus position is present within the in-focus determination range. Alternatively, the camera microcomputer 114 may determine whether the in-focus position is present within a focus position range obtained by shifting the width of the in-focus determination range in the closest distance direction and the infinite distance direction with respect to the current focus position. Furthermore, FIGS. 10A, 10B, and 10D illustrate examples in which the in-focus position (the position where the defocus amount becomes zero) is present within the in-focus determination range (the shaded region), and FIG. 10C illustrates an example in which the in-focus position is not present within the in-focus determination range.

In step S707, the camera microcomputer 114 sets the MF focus driving speed stored in step S703 to the driving speed of the focus lens 105. Then, the processing proceeds to step S708. In step S708, the camera microcomputer 114 drives the focus lens 105 up to the detected in-focus position at the driving speed set in step S707. Then, in step S710, the processing ends.

As described above, the present exemplary embodiment is configured to, when performing focus adjustment by AF after an MF operation for the purpose of correcting the focus position effected by the MF operation, correct the focus position if an in-focus position is present within a predetermined range from the focus position effected by the MF operation. Furthermore, the present exemplary embodiment is configured to, when correcting the focus position, drive the focus lens based on the driving speed used during the MF operation, so that high-precision and smooth focus adjustment can be performed even in the process of capturing a moving image. Furthermore, since the focus detection of the imaging-plane phase difference system according to the present exemplary embodiment does not necessitate moving the focus lens beyond the in-focus position, any blurred image caused by the movement of the focus lens can be prevented from being recorded.

In the image sensor according to the first exemplary embodiment, a light flux that the focus detection pixel (the first focus detection pixel and the second focus detection pixel) receives and a light flux that the imaging pixel receives are different from each other. Therefore, the influence of the various aberrations (such as spherical aberration, astigmatism, and coma) of the imaging optical system on the focus detection pixel is different from that on the captured image signal. In particular, as the aperture value of the imaging optical system is smaller (brighter), the difference becomes greater. Therefore, when the aperture value of the imaging optical system is small (bright), a difference may occur between the detected in-focus position calculated by the focus detection of the phase difference system and the best in-focus position for a captured image signal.

The first exemplary embodiment has been described on the assumption that the detected in-focus position and the best in-focus position coincide with each other. However, in particular, when the aperture value of the imaging optical system is equal to or less than a predetermined aperture value, the focus detection accuracy of the focus detection of the phase difference system may decrease in some cases.

Here, the detected in-focus position is a position where the defocus amount becomes zero. Furthermore, the best in-focus position for a captured image signal is a modulation transfer function (MTF) peak position of the captured image signal.

Accordingly, in order to reduce a difference between the detected in-focus position calculated from a focus detection signal and the best in-focus position for a captured image signal, a second exemplary embodiment is configured to perform focus detection of the rear focus system, which is capable of performing high-accuracy focus detection in the vicinity of the best in-focus position of the imaging optical system. This enables more high-accuracy focus detection.

A method for the focus detection of the rear focus system according to the second exemplary embodiment is described below. The method includes relatively shifting and adding the first focus detection signal and the second focus detection signal, thus generating a shift addition signal (a refocus signal). Then, the method includes calculating a contrast evaluation value of the generated shift addition signal (the refocus signal), estimating the MTF peak position of a captured image signal from the contrast evaluation value, and detecting a detected defocus amount.

Figure 11:
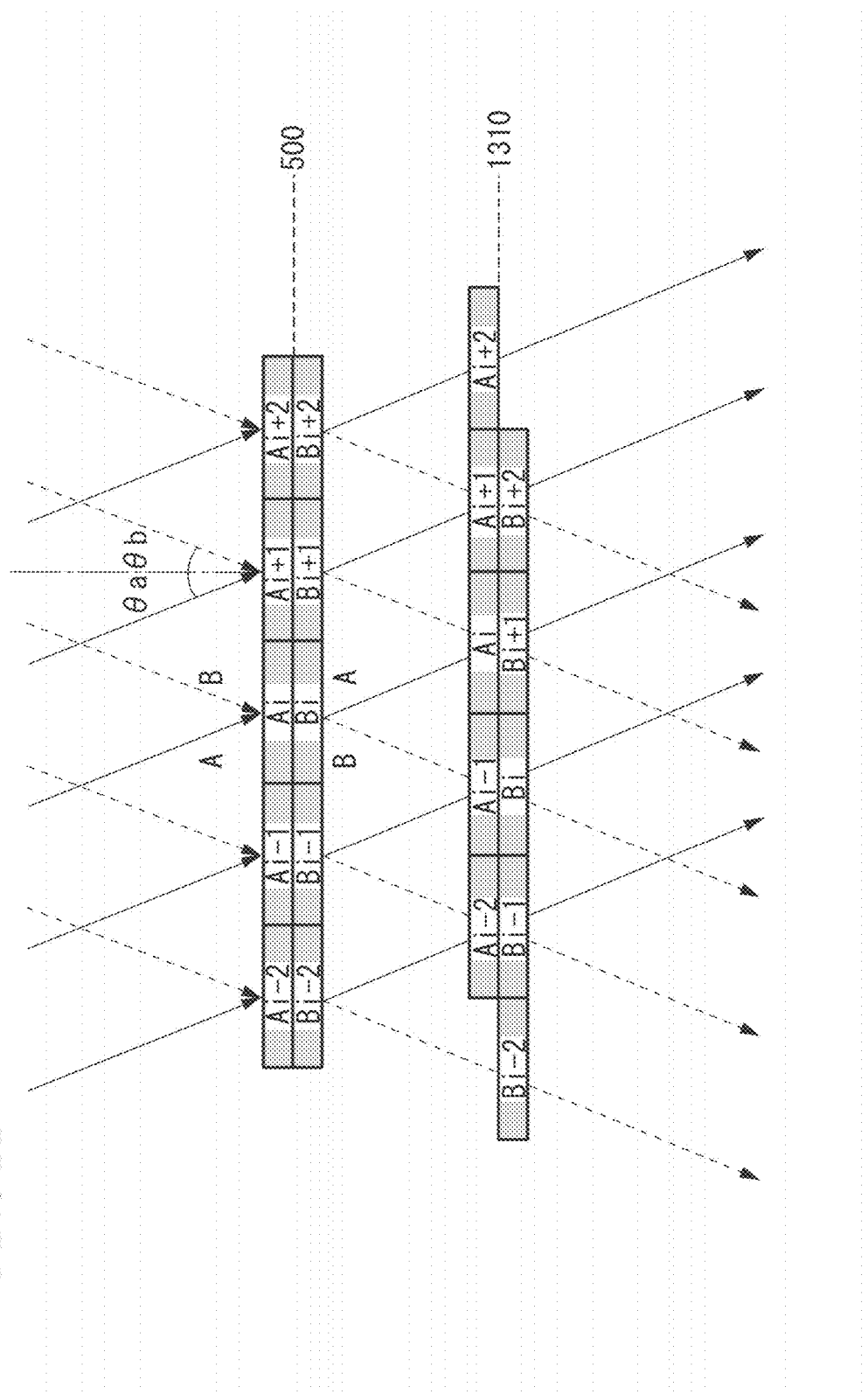
FIG. 11 is a schematic diagram illustrating refocus processing according to the first exemplary embodiment.

FIG. 11 illustrates refocus processing in a one-dimensional direction (row direction or horizontal direction) using the first focus detection signal and the second focus detection signal acquired by the image sensor according to the present exemplary embodiment. In FIG. 11, portions similar to those illustrated in FIGS. 5 and 6 are assigned the respective same reference characters.

Referring to FIG. 11, with "i" set as an integer number, the first focus detection signal of the i-th pixel in the row direction arranged on the imaging plane 500 is schematically represented by Ai, and the second focus detection signal is schematically represented by Bi. The first focus detection signal Ai is a received light signal resulting from a light flux incident on the i-th pixel at a principal ray angle θa (corresponding to the pupil partial region 401 illustrated in FIG. 5). The second focus detection signal Bi is a received light signal resulting from a light flux incident on the i-th pixel at a principal ray angle θb (corresponding to the pupil partial region 402 illustrated in FIG. 5).

The first focus detection signal Ai and the second focus detection signal Bi each contain not only light intensity distribution information but also incident angle information. Therefore, a refocus signal can be generated by moving in parallel the first focus detection signal Ai along the angle θa up to a virtual imaging plane 1310, moving in parallel the second focus detection signal Bi along the angle θb up to the virtual imaging plane 1310, and then adding the moved first focus detection signal and the moved second focus detection signal. Moving in parallel the first focus detection signal Ai along the angle θa up to the virtual imaging plane 1310 corresponds to +0.5 pixel shift in the row direction. Moving in parallel the second focus detection signal Bi along the angle θb up to the virtual imaging plane 1310 corresponds to −0.5 pixel shift in the row direction. Accordingly, a refocus signal on the virtual imaging plane 1310 can be generated by relatively shifting the first focus detection signal Ai and the second focus detection signal Bi by +1 pixel and then associating and adding the first focus detection signal Ai and the second focus detection signal Bi+1. Similarly, a shift addition signal (refocus signal) on each virtual imaging plane associated with an integer amount of shifting can be generated by shifting the first focus detection signal Ai and the second focus detection signal Bi by an integer number of pixels and adding the shifted first focus detection signal and the shifted second focus detection signal. Then, the focus detection of the rear focus system can be performed by calculating a contrast evaluation value of the generated shift addition signal (refocus signal) and estimating an MTF peak value of the captured image signal based on the calculated contrast evaluation value.

While, in the first exemplary embodiment, the in-focus determination range is set according to the focus driving speed used during an MF operation or the MF operation direction information, the second exemplary embodiment is described on the assumption that the in-focus determination range is arbitrarily settable by the operator.

Figure 12:
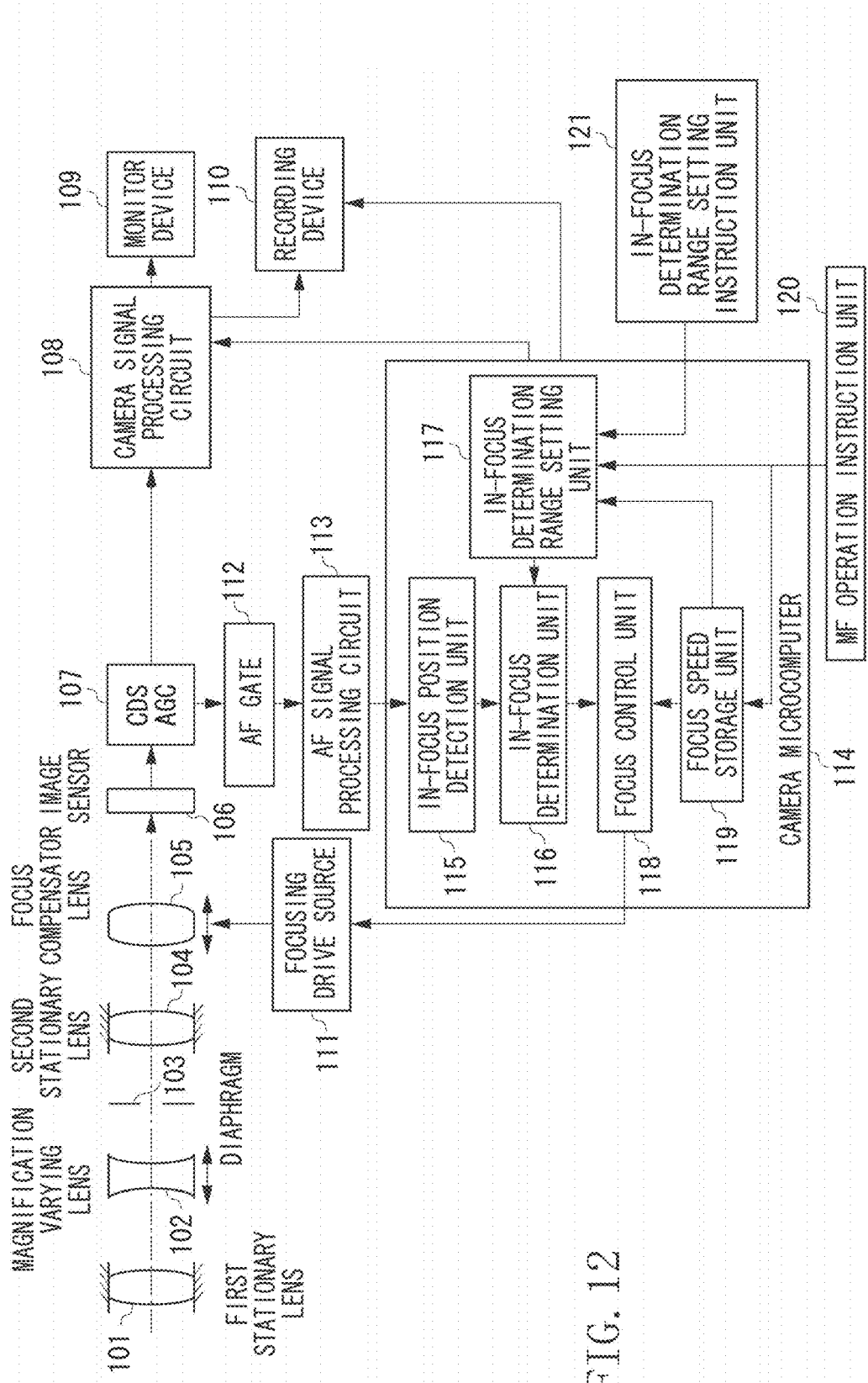
FIG. 12 is a block diagram illustrating a configuration of a video camera including a focus adjustment apparatus according to a second exemplary embodiment.

FIG. 12 illustrates a configuration of a video camera (an imaging apparatus) including a focus adjustment apparatus according to the present exemplary embodiment. The configuration according to the present exemplary embodiment further includes an in-focus determination range setting instruction unit 121 in addition to the configuration of the first exemplary embodiment. The other constituent elements are similar to those of the first exemplary embodiment, and the similar constituent elements are assigned the respective same reference numerals as those in the first exemplary embodiment.

The in-focus determination range setting instruction unit 121 is an instruction unit configured to allow the operator to arbitrarily set the in-focus determination range. In the in-focus determination range setting instruction unit 121, setting items are provided on a menu or the like, and the operator is allowed to set the in-focus determination range, for example, in increments of 0.1 times from 0.5 times to 5 times based on the depth of focus. The in-focus determination range setting instruction unit 121 my finely adjust the change rate of the in-focus determination range determined according to the MF operation speed or the MF operation direction, described in the first exemplary embodiment, or may inhibit the setting itself of the in-focus determination range. For example, if the in-focus determination range setting instruction unit 121 inhibits the setting of the in-focus determination range, the focus lens can be kept at the focus position located at the time of the end of the MF operation without performing a focus adjustment operation for correcting for a deviation of focus after the MF operation. Furthermore, such a setting can be performed that when the in-focus determination range is set relatively wide, it becomes easy to correct for a deviation of focus, and when the in-focus determination range is set relatively narrow, it becomes difficult to correct for a deviation of focus. Moreover, the second exemplary embodiment is described on the assumption that the in-focus position detection unit 115 detects an in-focus position using the focus detection method of the rear focus system. However, the focus detection may be performed using a combination of the focus detection of the phase difference system, employed in the first exemplary embodiment, and the focus detection of the rear focus system, employed in the present exemplary embodiment.

Next, the flow of the entire processing according to the present exemplary embodiment is described with reference to FIG. 13. This processing is executed according to a computer program stored in the camera microcomputer 114. The flow illustrated in FIG. 13 is basically the same as the flow illustrated in FIG. 7, but is different in that step S704 is replaced by focus detection of the rear focus system (step S1304), which is described below. The other processing in steps S1301 to S1303 and steps S1305 to S1310 is similar to that in the first exemplary embodiment, and is, therefore, omitted from the description.

FIG. 14 illustrates the flow of processing for the focus detection operation of the rear focus system performed in step S1304 according to the present exemplary embodiment.

In step S1401, the processing starts. In step S1402, the camera microcomputer 114 acquires a first focus detection signal (image A) from a received light signal output from the first focus detection pixel in a focus detection area set by the AF gate 112 and acquires a second focus detection signal (image B) from a received light signal output from the second focus detection pixel in the focus detection area.

In step S1403, the camera microcomputer 114 performs, via an image processing unit (not illustrated), processing for adding three pixels in the column direction, for the purpose of decreasing the amount of signal data, with respect to each of the first focus detection signal and the second focus detection signal. The camera microcomputer 114 further performs Bayer (RGB) addition processing to convert R, G, and B signals into a luminance Y signal. These two addition processing operations are collectively referred to as "pixel addition processing". Where appropriate, any one or both of the three-pixel addition processing and the Bayer (RGB) addition processing may be omitted.

In step S1404, the camera microcomputer 114 performs second filter processing on the first focus detection signal and the second focus detection signal. In the present exemplary embodiment, the focus detection of the rear focus system is performed from a small defocus state up to the vicinity of the best in-focus position. Accordingly, the pass band of the second filter processing in the present exemplary embodiment is configured to include a high-frequency band more than the pass band of the first filter processing in the first exemplary embodiment. Where appropriate, the pass band of the filter processing may be configured to include a more high-frequency band by using a Laplacian-type (second-order derivative type) [1,−2,1] filter for extracting edges of an object signal for the second filter processing. Extracting and using a high-frequency component of the object for focus detection can improve focus detection accuracy.

In step S1405, the camera microcomputer 114 performs shift processing for relatively shifting the first focus detection signal and the second focus detection signal, which has been subjected to the second filter processing, in the pupil division direction, and adds the shifted first focus detection signal and the shifted second focus detection signal, thus generating a shift addition signal (refocus signal). Then, the camera microcomputer 114 calculates a contrast evaluation value from the generated shift addition signal.

Suppose that the k-th first focus detection signal subjected to the filter processing is A(k), the k-th second focus detection signal subjected to the filter processing is B(k), and the range of numbers k corresponding the focus detection area is W. When the amount of shifting used for the shift processing is $s_2$ and the range of shift with the amount of shifting $s_2$ is $\Gamma 2$, the contrast evaluation value RFCON is calculated using the following equation (2):

$$RFCON(s_2) = \max_{k \in W} |A(k) - B(k - s_2)|, s_2 \in \Gamma 2 \qquad (2)$$

The camera microcomputer 114 performs shift processing with the amount of shifting $s_2$ to associate the k-th first focus detection signal A(k) with the (k-$s_2$)th second focus detection signal B(k-$s_2$) and perform addition thereof, thus generating a shift addition signal. Then, the camera microcomputer 114 calculates the contrast evaluation value RFCON ($s_2$) by calculating the absolute value of the generated shift addition signal and obtaining the maximum value within the range W corresponding to the focus detection area. Where appropriate, the camera microcomputer 114 may add the contrast evaluation values calculated in the respective rows for each amount of shifting over a plurality of rows. Furthermore, as the amount of shifting changes, the peak signal of the shift addition signal changes. FIG. 15 illustrates an example of the contrast evaluation values calculated from the respective shift addition signals. In FIG. 15, the abscissa axis indicates the amount of shifting, and the ordinate axis indicates a contrast evaluation value.

In step S1406, the camera microcomputer 114 performs sub-pixel computation based on the calculated contrast evaluation value to calculate the real-valued amount of shifting causing the contrast evaluation value to become maximum, and sets the calculated amount of shifting as a peak shift amount p2. Then, the camera microcomputer 114 calculates a detected defocus amount (Def1) by multiplying the peak shift amount p2 by the image height of the focus detection area, the F-number of the imaging lens (imaging optical system), and a conversion coefficient corresponding to the exit pupil distance. Then, in step S1407, the processing ends.

In the present exemplary embodiment, a focus detection unit of the rear focus system generates a shift addition signal by performing the second filter processing and the shift processing on the first focus detection signal and the second focus detection signal and then adding the processed first focus detection signal and the processed second focus detection signal. Then, the focus detection unit of the rear focus system calculates a contrast evaluation value from the shift addition signal, and detects a detected defocus amount from the calculated contrast evaluation value.

In the image sensor according to the present exemplary embodiment, a light flux obtained by adding a light flux received by the first focus detection pixel and a light flux received by the second focus detection pixel becomes a light flux received by the imaging pixel, as illustrated in FIGS. 4 and 5. Unlike the focus detection of the phase difference system, focus detection of the rear focus system is performed using a shift addition signal (refocus signal) obtained from the first focus detection signal and the second focus detection signal. Therefore, since a light flux corresponding to the shift addition signal used for focus detection almost coincides with a light flux corresponding to a captured image signal, the influence of various aberrations (spherical aberration, astigmatism, coma, etc.) of the imaging optical system on the shift addition signal is almost the same as the influence thereof on the captured image signal. Accordingly, since a detected in-focus position calculated by the focus detection of the rear focus system (a position where the detected defocus amount becomes zero) almost coincides with the best in-focus position of the captured image signal (the MTF peak position), the present exemplary embodiment can attain focus detection higher in accuracy than the focus detection of the phase difference system in the first exemplary embodiment. Furthermore, while, in the present exemplary embodiment, each imaging pixel is divided in the horizontal direction, a similar operation effect can be attained even if each imaging pixel is divided in the vertical direction.

As described above, the present exemplary embodiment performs the focus detection of the rear focus system instead of the focus detection of the phase difference system, and, therefore, can attain more high-accuracy focus detection. Furthermore, the present exemplary embodiment is configured to allow the operator to arbitrarily set the in-focus determination range, thus enabling such a customization as to make it easy to shift to a correction operation for a deviation from the in-focus position according to a habit of the MF operation or as to inhibit the correction operation. Accordingly, it is possible to perform high-accuracy and smooth focus adjustment by an MF operation while estimating an intention of the operator.

In the above-described exemplary embodiments, when focus adjustment is performed by AF for the purpose of correcting the focus position obtained by an MF operation, such a driving operation is performed as to correct the focus position based on a focus driving speed used during the MF operation if an in-focus position is present within a predetermined range from the focus position obtained by the MF operation. Therefore, smooth focus adjustment can be performed even in the process of capturing a moving image. Furthermore, in the focus detection methods according to the above-described exemplary embodiments, since it is not necessary to move the focus lens beyond the in-focus position, it is possible to perform high-accuracy focus correction while preventing an instantaneously blurred image from being recorded.

The present invention can be applied not only to an apparatus primarily intended to be used for shooting, such as a video camera, but also to an arbitrary apparatus with a built-in or externally-connected focus adjustment apparatus, such as a personal computer (laptop type, desktop type, tablet type, etc.) and a game machine. Accordingly, the term "focus adjustment apparatus" in the present specification is intended to include an arbitrary electronic apparatus having a focus adjustment function. While exemplary embodiments of the present invention have been described above, the present invention is not limited to the above-described exemplary embodiments, but can be varied or altered in various manners within the spirit and scope of the present invention.

Certain aspects of the embodiments described above may be implemented by a computer of a system or apparatus that reads out and executes computer executable instructions recorded on a storage medium (e.g., non-transitory computer-readable storage medium). The functions of one or more of the above-described embodiment(s) of the present invention, and a method, may be performed by the computer of the system or apparatus by, for example, reading out and executing the computer executable instructions from the storage medium to perform the functions of one or more of the above-described embodiment(s). The computer may comprise one or more of a central processing unit (CPU), processor(s), micro processing units (MPU), and/or other circuitry, and may include a network of separate computers or separate computer processors. The computer executable instructions may be provided to the computer, for example, from a network or the storage medium. The storage medium may include, for example, one or more of a hard disk, a random access memory (RAM), a read-only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-096146 filed May 7, 2014, which is hereby incorporated by reference herein in its entirety.

What is claimed is:

1. A focus adjustment apparatus comprising:
a manual focus unit configured to move a focus lens on a basis of manual operation by a user, a movement speed of the focus lens being dependent on a speed of the manual operation by the user during manual focusing;
a storage unit configured to store the movement speed of the focus lens in a state in which the manual focus unit is operated by the user;
a control unit that performs control such that the movement speed of the focus lens in the state in which the manual focus unit is operated by the user is repetitively updated and stored in the storage unit during the manual focusing;
an automatic focusing unit configured to detect a focusing state of the focus lens on a basis of an output signal obtained from an imaging unit configured to photoelectrically convert light that has passed through the focus lens; and
a determination unit configured to determine, after movement of the focus lens by the manual focus unit, whether or not an in-focus position is present within a predetermined range from a position of the focus lens moved by the manual focus unit on a basis of the focusing state detected by the automatic focusing unit,
wherein, in a case where it is determined by the determination unit that an in-focus position is present within the predetermined range from the position of the focus lens moved by the manual focus unit, the automatic focusing unit uses the movement speed repetitively updated and stored in the storage unit to move the focus lens to an in-focus position at the movement speed used during the manual focusing of the focus lens.

2. The focus adjustment apparatus according to claim 1, wherein, in a case where the determination unit determines that no in-focus position is present within the predetermined range from the position of the focus lens moved by the manual focus unit, the position of the focus lens is kept at the position where the focus lens has been moved by the manual focus unit.

3. The focus adjustment apparatus according to claim 1, wherein the imaging unit generates a pair of image signals by photoelectrically converting light fluxes that have passed through different pupil regions of an imaging optical system, and
wherein the automatic focusing unit detects the focusing state based on an image deviation amount of the pair of image signals.

4. The focus adjustment apparatus according to claim 1, wherein the imaging unit generates a pair of image signals by photoelectrically converting light fluxes that have passed through different pupil regions of an imaging optical system, and
wherein the automatic focusing unit detects the focusing state based on a contrast evaluation value of a refocus signal generated by performing shift processing on the pair of image signals and adding the processed pair of image signals.

5. The focus adjustment apparatus according to claim 1, wherein the determination unit determines whether a difference between an in-focus position determined based on the focusing state detected by the focus detection unit and the current position of the focus lens is within the predetermined range.

6. The focus adjustment apparatus according to claim 1, wherein the predetermined range is set based on a depth corresponding to an aperture value.

7. The focus adjustment apparatus according to claim 1, wherein the predetermined range is set based on the movement speed stored in the storage unit.

8. The focus adjustment apparatus according to claim 7, wherein the predetermined range is set to a first range when the movement speed stored in the storage unit is a first speed, and is set to a second range narrower than the first range, when the movement speed is a second speed lower than the first speed.

9. The focus adjustment apparatus according to claim 7, wherein the predetermined range that is set when the movement speed stored in the storage unit is higher than a first threshold value is set wider than the predetermined range that is set when the movement speed is equal to or lower than the first threshold value.

10. The focus adjustment apparatus according to claim 1, wherein the predetermined range is set according to an operation direction of the manual operation.

11. The focus adjustment apparatus according to claim 10, wherein the predetermined range is set such that a range thereof extending in a direction corresponding to the operation direction of the manual operation with respect to the position of the focus lens is wider than a range thereof extending in a direction opposite the operation direction of the manual operation with respect to the position of the focus lens.

12. The focus adjustment apparatus according to claim 1, further comprising a setting unit configured to allow the user to set the predetermined range.

13. The focus adjustment apparatus according to claim 1, wherein the control unit performs control such that, during the manual focusing, an average speed of plural focus driving speeds is calculated, and the calculated average speed is stored into the storage unit.

14. A control method for a focus adjustment apparatus, the control method comprising:
moving a focus lens on a basis of manual operation by a user, a movement speed of the focus lens being dependent on a speed of the manual operation by the user during manual focusing;
storing the movement speed of the focus lens in a storage unit in a state in which the focus lens is moved on the basis of the manual operation by the user;
controlling such that the movement speed of the focus lens in the state in which the manual focus unit is operated by the user is repetitively updated and stored in the storage unit during the manual focusing,
detecting a focusing state based on a signal output from an imaging unit configured to photoelectrically convert light that has passed through the focus lens into an electric signal; and
determining, after movement of the focus lens on the basis of the manual operation by the user, whether or not an in-focus position is present within a predetermined range from a position of the focus lens moved on the basis of the manual operation by the user,
wherein, in a case where it is determined that an in-focus position is present within the predetermined range from the position of the focus lens moved on the basis of the manual operation by the user, using the movement speed repetitively updated and stored in the storage unit to move the focus lens to an in-focus position at the movement speed used during the manual focusing of the focus lens.

15. A computer-readable storage medium storing a program that causes a computer to perform a control method for a focus adjustment apparatus, the control method comprising:

moving a focus lens on a basis of a user's manual operation of a manual focus unit, a movement speed of the focus lens being dependent on a speed of the manual operation by the user during manual focusing;

storing the movement speed of the focus lens in a storage unit in a state in which the focus lens is moved on the basis of the manual operation by the user;

controlling such that the movement speed of the focus lens in the state in which the manual focus unit is operated by the user is repetitively updated and stored in the storage unit during the manual focusing, detecting a focusing state based on a signal output from an imaging unit configured to photoelectrically convert light that has passed through the focus lens into an electric signal; and determining, after movement of the focus lens on the basis of the manual operation by the user, whether or not an in-focus position is present within a predetermined range from a position of the focus lens moved on the basis of the manual operation by the user, wherein, in a case where it is determined that an in-focus position is present within the predetermined range from the position of the focus lens moved on the basis of the manual operation by the user, using the movement speed repetitively updated and stored in the storage unit to move the focus lens to an in-focus position at the movement speed used during the manual focusing of the focus lens.

16. A focus adjustment apparatus comprising:

an imaging unit configured to photoelectrically convert light that has passed through an imaging optical system including a focus lens into an electrical signal, wherein the focus lens is configured to be moved according to an instruction for a manual operation;

a focus detection unit configured to detect a focusing state based on a signal output from the imaging unit;

a determination unit configured to make a determination of whether an in-focus position is present within a predetermined range from a current position of the focus lens based on the focusing state detected by the focus detection unit;

a control unit configured to perform control to correct the position of the focus lens moved by the manual operation according to a result of the determination made by the determination unit; and an acquisition unit configured to acquire from a storage unit a movement speed of the focus lens corresponding to the manual operation, wherein the control unit performs control to move the focus lens at a speed determined based on the movement speed acquired from the storage unit, wherein the imaging unit generates a pair of image signals by photoelectrically converting light fluxes that have passed through different pupil regions of the imaging optical system, and wherein the focus detection unit detects the focusing state based on a contrast evaluation value of a refocus signal generated by performing shift processing on the pair of image signals and adding the processed pair of image signals.

\* \* \* \* \*